(12) United States Patent
Kannengiesser et al.

(10) Patent No.: US 7,982,939 B2
(45) Date of Patent: Jul. 19, 2011

(54) BEAM STEERING USING A THERMALLY ANISOTROPIC MEDIUM

(75) Inventors: Christian Kannengiesser, Lübeck (DE); Ruediger Von Elm, Wielen (DE)

(73) Assignee: Coherent GmbH, Göttingen (DE)

( * ) Notice: Subject to any disclaimer, the term of this patent is extended or adjusted under 35 U.S.C. 154(b) by 56 days.

(21) Appl. No.: 12/628,548

(22) Filed: Dec. 1, 2009

(65) Prior Publication Data
US 2011/0128609 A1    Jun. 2, 2011

(51) Int. Cl.
*G02F 1/01* (2006.01)
*G02F 1/29* (2006.01)
*G02F 1/00* (2006.01)

(52) U.S. Cl. .......................... 359/288; 359/298; 359/322

(58) Field of Classification Search ................. 359/240, 359/288, 298, 321, 322, 328; 372/21, 22; 385/31, 52
See application file for complete search history.

(56) References Cited

U.S. PATENT DOCUMENTS

| | | | |
|---|---|---|---|
| 6,370,168 | B1 | 4/2002 | Spinelli |
| 7,242,700 | B2 | 7/2007 | Wang |
| 7,852,886 | B2 * | 12/2010 | Miller et al. ............ 372/21 |
| 2008/0037598 | A1 * | 2/2008 | Miller et al. ............ 372/21 |

* cited by examiner

*Primary Examiner* — David N Spector
(74) *Attorney, Agent, or Firm* — Morrison & Foerster LLP (57) ABSTRACT

Apparatus for steering a beam of radiation includes a thermally anisotropic element configured such that the shape of the optical element can be varied by varying the temperature of the element. The beam is reflected from or transmitted through the element in a manner such that the direction of the beam on leaving the element can be varied by the change of shape resulting from the temperature variation.

20 Claims, 7 Drawing Sheets

BEAM STEERING USING A THERMALLY ANISOTROPIC MEDIUM

TECHNICAL FIELD OF THE INVENTION

The present invention relates in general to optical beam steering devices. The invention relates in particular to beam-steering devices for providing extremely fine spatial or angular alignment changes in a beam.

DISCUSSION OF BACKGROUND ART

In optical systems it is sometimes necessary to provide extremely fine spatial or angular alignment of a laser beam. The terminology extremely fine as used here implies spatial alignment changes on the order of a few micrometers (μm) and angular alignment changes of a milliradian (mrad) or less. One example wherein fine alignment is required is steering a laser beam into a single mode core of an optical fiber.

Fine beam alignment (beam steering) is typically done by reflecting a beam from one or more mirrors tilted in one or two axes by some kind of precision actuator. Such actuators include peristaltic actuators, piezoelectric actuators, magnetic actuators and even very fine differential screw mechanisms. In each case, a mechanical linkage is needed between the actuator and the mirror being actuated. Because of this it is possible for a mirror, once aligned to become misaligned, for example, through vibration or shock thereby requiring the mirror to be re-aligned. It would be advantageous to have a more positive fine alignment than current arrangements provide.

SUMMARY OF THE INVENTION

In one aspect of the present invention, apparatus for steering a beam of radiation comprises a thermally anisotropic element configured such that the shape of the optical element can be varied by varying the temperature of the element. Means are provided for varying the temperature of the thermally anisotropic element. The beam is either reflected from or transmitted through the element in a manner such that the direction of the beam on leaving the element can be varied by the change of shape resulting from the temperature variation.

A wide range of temperature coefficients of beam steering can be obtained dependent on the particular thermally anisotropic material selected. By way of example, a lithium borate (LBO) crystal has a peak coefficient more than an order of magnitude greater than that of lithium niobate ($LiNbO_3$) crystal, which in turn has a peak coefficient an order of magnitude greater than that of an aluminum oxide ($Al_2O_3$) crystal.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
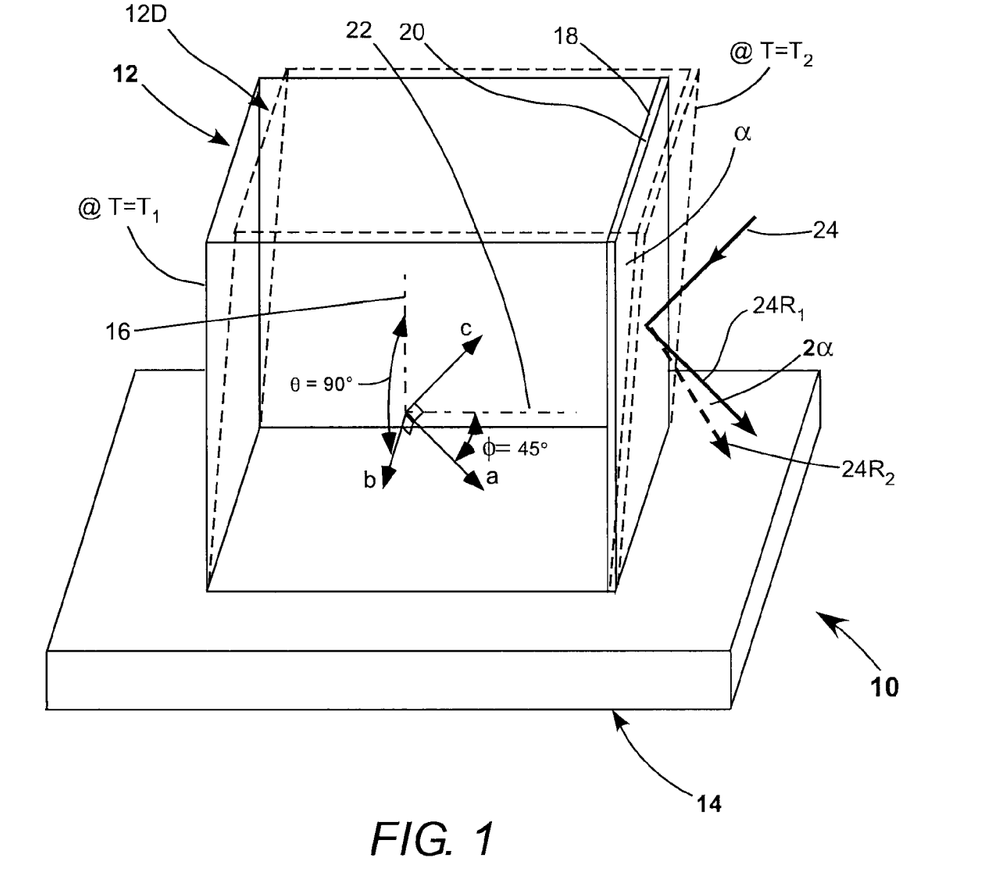
FIG. 1 schematically illustrates one preferred embodiment of a reflective beam steering module in accordance with the present invention including an optically nonlinear crystal supported on a thermo-electrically heated base-plate for varying the crystal temperature, the crystal being cut in the form of a cube at an ambient temperature with a vertical axis perpendicular to the b-axis of the crystal and with the a-axis of the crystal at an angle of 45 degrees to a normal to a surface of the crystal on which a reflective coating is deposited, and the crystal being deformed into a parallelepiped when the crystal temperature is varied from ambient causing tilting of the reflective coated surface.
Figure 1A:
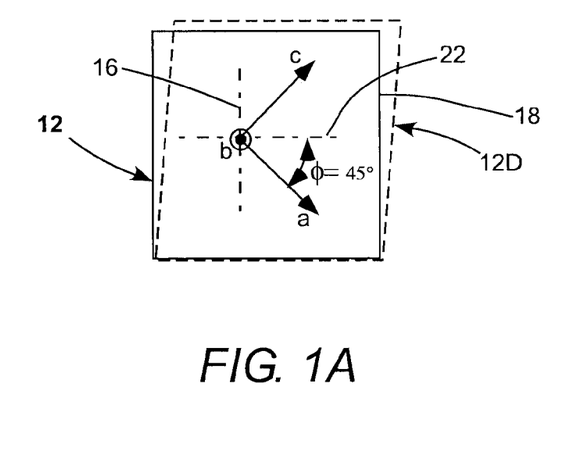
FIG. 1A is a front elevation view schematically illustrating further detail of the crystal axis orientations of the crystal 12 of FIG. 1.

Referring now to the drawings, wherein like components are designated by like reference numerals, FIG. 1 and FIG. 1A schematically illustrates one preferred embodiment 10 of a beam-steering module in accordance with the present invention. Module 10 includes an optically nonlinear crystal 12 bonded to or clamped on a thermo-electric heater/cooler (TEC) base-plate 14. Suitable bonding and clamping methods are described further hereinbelow.

Crystal 12 has mutually perpendicular crystal axes a, b, and c, and here, is formed into a cube, at some ambient temperature $T=T_1$, and cut such that b-axis of the crystal is perpendicular to a vertical axis 16 of the cube, a condition usually referred to as $\theta=90°$ by practitioners of the art. It is pointed out here that the a, b, and c crystal axes are often referred to as x, y, and z axes, respectively by practitioners of the art. The a-, b-, and c-axis nomenclature is selected, here, as X, Y, and Z are used to define system Cartesian axes, further hereinbelow.

Continuing with reference to FIG. 1, lateral face 18 of the crystal has a reflective coating 20 deposited thereon. The a-axis of the crystal is inclined at an angle $\phi$, here 45°, to a lateral axis 22, which is normal to reflective coated surface 18 of the crystal. Most optically nonlinear crystals have different coefficients of thermal expansion (CTE) in different orientations. By way of example lithium borate (LBO) has a CTE of 108 ppm/K in the a-axis direction and −88 ppm/K in the c-axis direction. If the crystal a-axis and b-axis were arranged in as in FIG. 1, with $\theta=90°$ and $\phi=45°$, the crystal will, on heating to a temperature $T_2$ higher than $T_1$, deform into a parallelepiped 12D (indicated by dashed lines in FIG. 1), with faces of the parallelepiped inclined at an angle $\alpha$ to the vertical, where $\alpha$ is given by an equation:

$$\alpha = \sin(2\phi) * (CTE_a - CTE_c) * \Delta T \tag{1}$$

where $CTE_a$ and $((CTE_b))$ $CTE_c$ are CTEs in the a-axis and c-axis directions, respectively, and $\Delta T = T_2 - T_1$. For a crystal 12 of LBO with $\phi=45°$ as illustrated in FIG. 1, the temperature coefficient of $\alpha$ would have a value of 0.2 mrad/K. By changing angle $\phi$ to some other value any temperature coefficient of between 0.0 and 0.2 mrad/K could be achieved. If a beam of radiation 24 were incident on reflective coated face 14 at temperature $T_1$ provided a reflected beam $24R_1$, and the crystal were then heated to temperature $T_2$ the reflected beam would change inclination in space by an angle $2\alpha$ from the inclination at temperature $T_1$ as illustrated by bold dashed line $24R_2$.

Figure 2A:
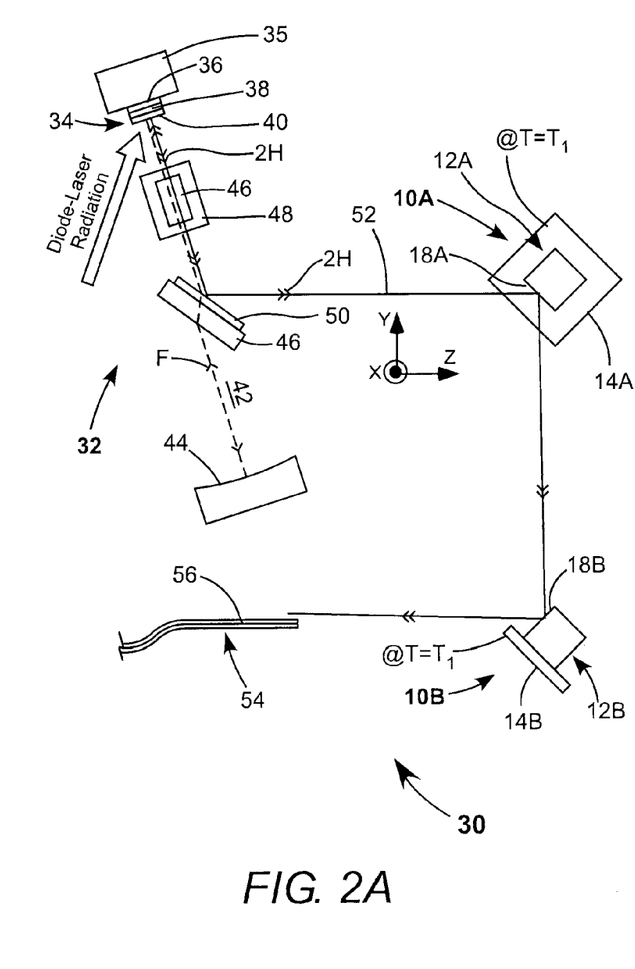
FIG. 2A schematically illustrates an optical system, including an intracavity frequency doubled OPS-laser and two reflective beam-steering modules in accordance with the present invention, similar to the module of FIG. 1 for steering an output beam of the laser into the core of an optical fiber, the crystals being at ambient temperature and the output beam being slightly misaligned with the fiber.

FIG. 2A schematically illustrates an optical system 30, including an intracavity frequency-doubled, optically pumped, external-cavity surface-emitting semiconductor laser (OPS-laser) 32. System 30 includes two reflective beam-steering modules 10A and 10B in accordance with the present invention, similar to module of 10 described above. Orientations in the system can be characterized generally by arbitrary Cartesian X, Y, and Z axes.

OPS-Laser 32 includes an OPS structure (OPS-chip) 34 including a mirror-structure 36 surmounted by an epitaxially grown semiconductor gain-structure 38 and a multilayer dichroic-filter 40. The OPS structure is supported on a heat-sink 35. OPS-laser 32 has a laser resonator 42 which is terminated by mirror structure 36 of the OPS-structure and a concave mirror 44. Diode-laser radiation is directed through dichroic filter 40 into gain-structure 38 of OPS-chip 34. This causes radiation having a fundamental wavelength within a gain-bandwidth characteristic of materials of the gain-structure to circulate in laser resonator 42 as indicated by single arrowheads F.

An optically nonlinear crystal 46 is located in the laser resonator adjacent to OPS-structure. Crystal 46 is configured (phase-matched) to convert fundamental-wavelength radiation F to second-harmonic (2H) radiation, in double-pass, as indicated by double arrowheads 2H. The crystal is mounted on a TEC 48 which serves to maintain the crystal at a fixed, phase-matching temperature. Dichroic filter 40 of OPS-structure 34 is highly reflective for the 2H-radiation and highly transmissive for fundamental-wavelength radiation F and the diode-laser radiation. Another dichroic filter 50 directs 2H-radiation out of the laser-resonator as output radiation in a beam 52 while transmitting the circulating fundamental radiation. Dichroic filter 50 is deposited, for convenience, on a birefringent filter 46. Birefringent filter 46 selects the fundamental wavelength at a value within the gain-bandwidth of the gain-structure. The wavelength selected is the wavelength for which optically nonlinear crystal 46 is phase-matched by the configuration and fixed phase-matching temperature.

In system 30 it is desired to steer beam 52 into core 56 of an optical fiber 54. Beam steering modules 10A and 10B are provided for this purpose. Module 10A is arranged essentially in the same way as module 10 of FIG. 1. Heating optically nonlinear crystal 12D thereof using TEC 14A causes reflective face 18A thereof to change the inclination of beam 52 thereon primarily in the X-Y plane of the drawing. Module 10B differs from module 10A only inasmuch as the module 10B is rotated through 90° relative to module 10A thereby causing reflective face 18B thereof to change the inclination of the beam primarily in the Y-Z plane of the drawing.

Figure 2B:
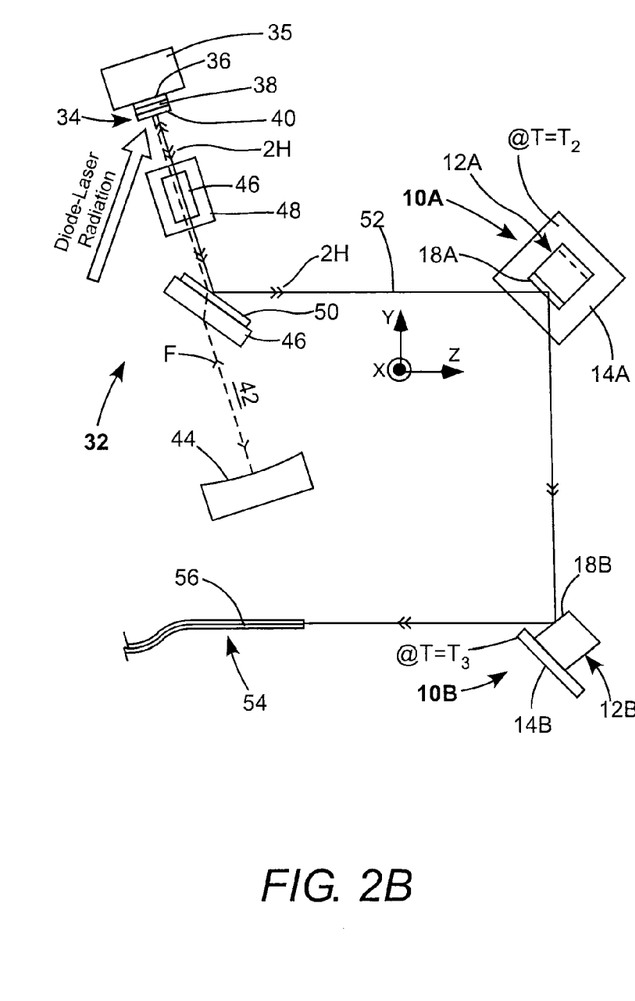
FIG. 2B schematically illustrates the optical system of FIG. 1 wherein the temperature of the crystals has been varied from the ambient temperature to cause the beam to be steered into alignment with the optical fiber.

Initially, steering is accomplished at ambient temperature by manually aligning the modules and fixing the modules in place on a base (not shown). In FIG. 2A this procedure has resulted in beam 52 missing the optical fiber to the right and below (seen from the direction of propagation). FIG. 2B depicts system 30 in a condition wherein crystal 12A has been heated from ambient $T_1$ to a temperature $T_2$ to raise the inclination of the beam in the X-Y plane, and crystal 12B has been heated from ambient to a temperature $T_3$ to shift the beam to the left in the Y-Z plane, as result of which the beam is aligned precisely with core 56 of optical fiber 54. A controller (not shown) can be used to adjust the power delivered to TEC's which in turn controls the temperature of the crystals.

A significant advantage of beam-steering using thermal distortion of the thermally anisotropic crystals is that it is absolute. Any given crystal will always have the same shape at any given temperature no matter how many times the crystal temperature is cycled from the given temperature to some other temperature (higher or lower) and back. Response to temperature change is essentially immediate and without hysteresis. There are no mechanical linkages that can fail, backlash, or vibrate.

While the present invention is described above with reference to the use of an optically nonlinear crystal in the inventive beam-steering module, any thermally anisotropic medium may be used. By way of example yttrium orthovanadate ($YVO_4$) and alumina ($Al_2O_3$) crystal have different CTEs in different crystal axes.

Figure 3:
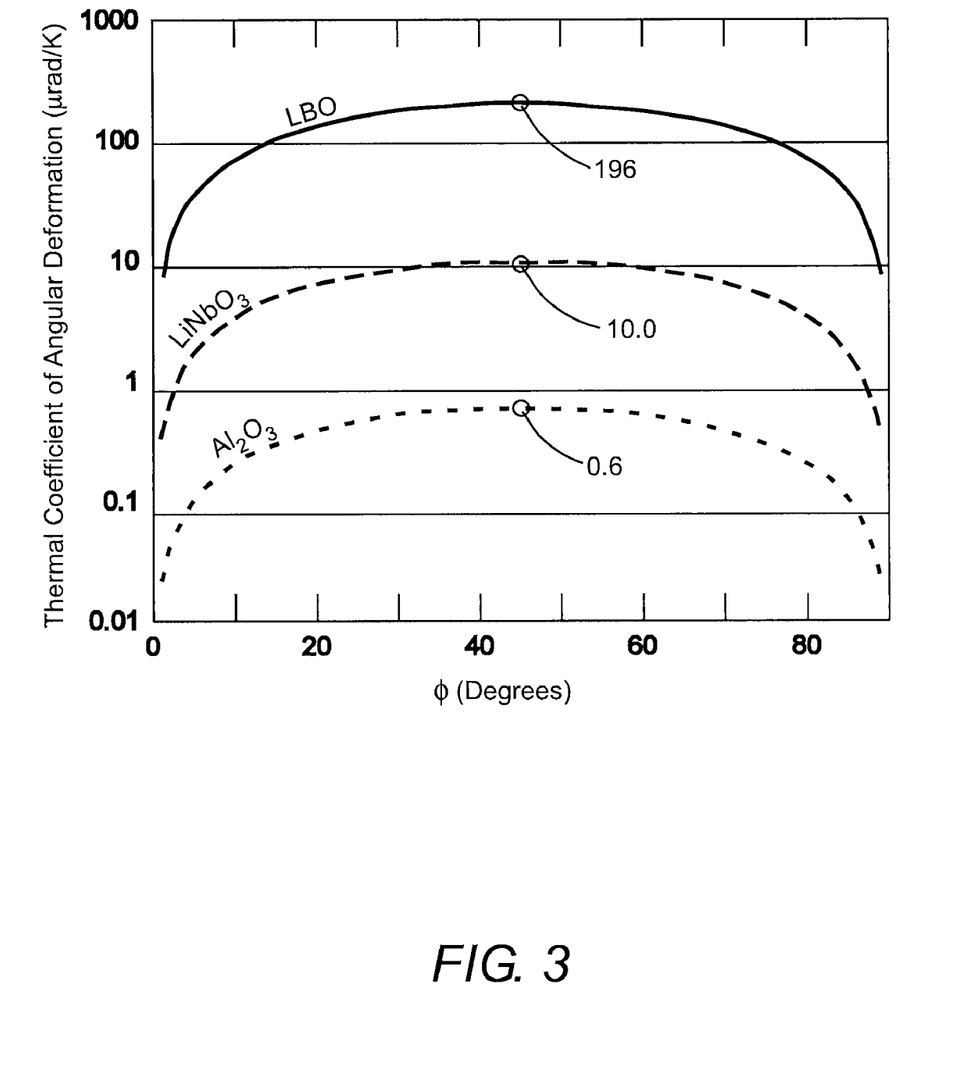
FIG. 3 is a graph schematically illustrating the thermal coefficient of angular deformation as a function of crystal cut angle ϕ with θ=90° for crystals of LBO, $LiNbO_3$, and $Al_2O_3$ having the shape of the crystal of FIG. 1.

FIG. 3 is a graph schematically illustrating the thermal coefficient of angular deformation as a function of crystal cut angle $\phi$ with $\theta=90°$ for crystals of LBO, lithium niobate ($LiNbO_3$), and $Al_2O_3$ having the shape of crystal 12 of FIG. 1. The coefficient for each material peaks at $\phi=45°$. The peaks values are 196 microradians/K ($\mu$rad/K), 10.0 $\mu$rad/K, and 0.6 $\mu$rad/K, respectively.

Beam steering modules in accordance with the present invention may also include an optically nonlinear crystal used in a transmission mode. In this mode, a beam may be spatially steered without any angular steering, or steered spatially and angularly, to a degree depending on the shape of the thermally anisotropic crystal. It should be noted, here, that if the thermally anisotropic crystal is an optically nonlinear crystal, the crystal cut angle should be selected such that, at any operating (steering) temperature contemplated, frequency conversion of radiation in a beam being steered can not occur.

Examples are described below with reference to FIGS. 4 through 6. In each example, the crystal at ambient temperature $T_1$ is depicted by a solid line and at temperature $T_2$ by a dashed line. Incident beam 24 is depicted by a bold solid line; the transmitted beam at temperature $T_1$ is depicted by a bold solid line, and the transmitted beam at temperature $T_2$ is depicted by a bold dashed line. In each example the crystal a-, b-, and c-axes are depicted and heating is effected by a TEC base-plate 14.

Figure 4:
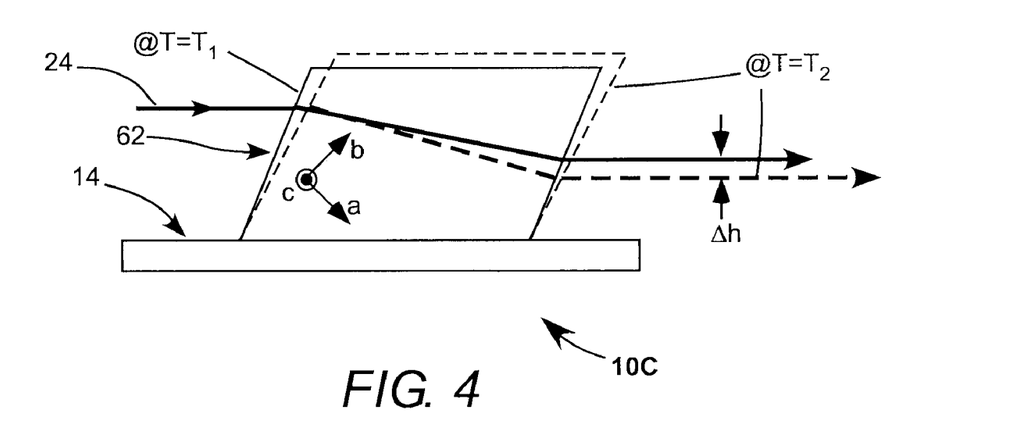
FIG. 4 schematically illustrates one preferred embodiment a transmissive beam-steering module in accordance with the present invention including an optically nonlinear crystal supported on a thermo-electric heater for varying the crystal temperature, the crystal being cut in the form of a parallelepiped at an ambient temperature with a lateral axis parallel to the b-axis of the crystal and with the a-axis of the crystal at an angle of 45 degrees to the longitudinal axis of the crystal, and the crystal being deformed when the crystal temperature is varied from ambient to a higher temperature causing a spatial shift in a beam transmitted through the crystal but with any change in angular orientation.

In module 10C of FIG. 4, Crystal 62, at both temperatures, is in the shape of a regular parallelepiped. This shape produces only a vertical spacing Δh between the transmitted beams at both temperatures, with the beams having the same angular orientation. In module 10D of FIG. 5, crystal 64 has an irregular polygon form. The entrance face of the crystal is non-orthogonally inclined to surface of the TEC and the exit face is vertically inclined to the surface of the TEC base-plate, at both temperatures. This shape produces a vertical shift and a change in angular orientation between the transmitted beams at temperatures $T_1$ and $T_2$. Those skilled in the art will recognize without further illustration that if the crystal were reversed such that beam 24 were incident on the vertically inclined face, there would be an angular orientation change in the transmitted beam without any significant vertical shift.

Figure 6:
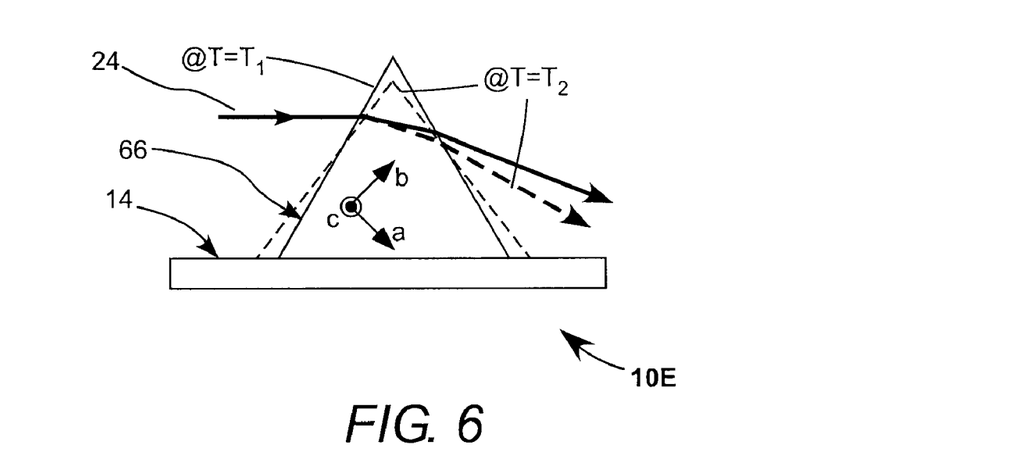
FIG. 6 schematically illustrates yet another preferred embodiment a transmissive beam-steering module in accordance with the present invention, similar to the module of FIG. 5 but wherein the crystal is an isosceles prism and deformation of the crystal with a change in temperature causes a change in both the spatial and angular orientation of a transmitted beam.

In module 10E of FIG. 6, crystal 66 has the form of an isosceles prism. This shape also produces vertical shift and change in angular orientation between the transmitted beams at temperatures $T_1$ and $T_2$. The vertical shift can be minimized by having the beam incident near the apex of the prism. The angular orientation change will be the same wherever beam 24 is incident on the prism.

Figure 5:
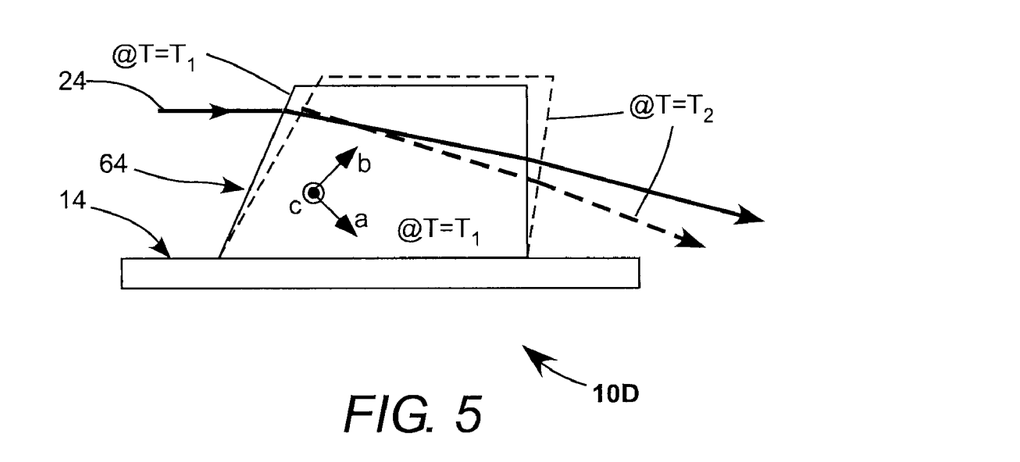
FIG. 5 schematically illustrates another preferred embodiment a transmissive beam-steering module in accordance with the present invention, similar to the module of FIG. 4 but wherein the crystal has an irregular polygon shape and deformation of the crystal with a change in temperature causes a change in both the spatial and angular orientation of a transmitted beam.

In each of modules of FIGS. 4-6, the crystal is supported on a TEC base-plate 14 and orientation changes occur in a plane perpendicular to the plane of the drawings. Those skilled in the art will recognize, without further illustration, that in each example the crystal could be rotated such that the crystal is supported on a lateral face thereof on the TEC base-plate, in which case the spatial or angular orientation change would occur in a plane perpendicular to the plane of the drawing.

Figure 7:
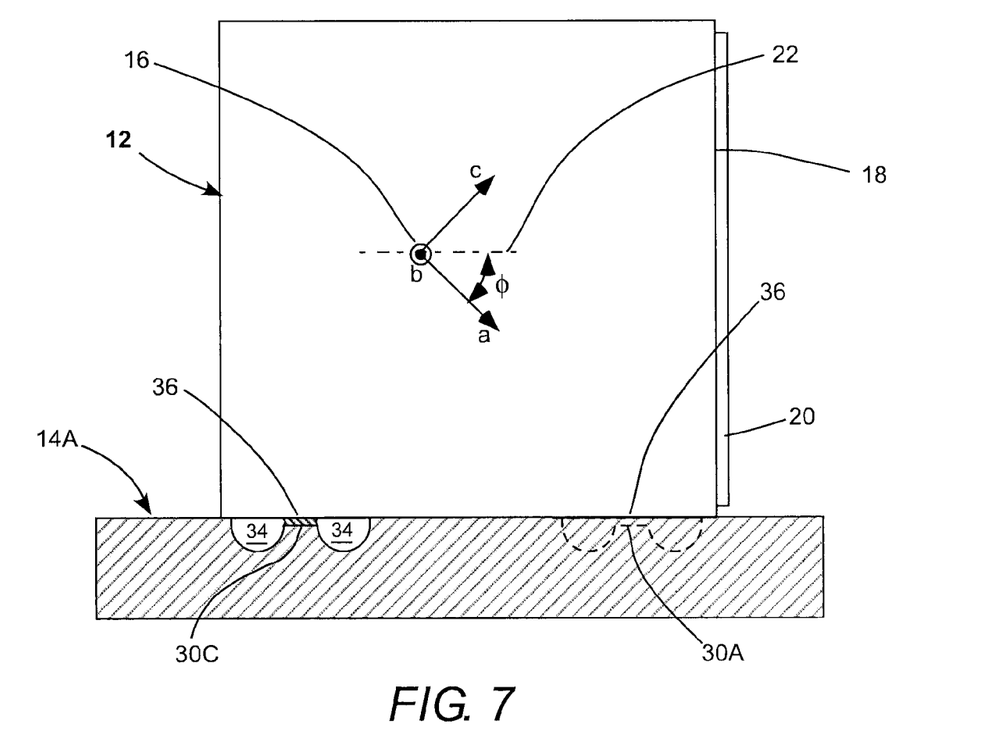
FIG. 7 and FIG. 7A schematically illustrate an arrangement in accordance with the present invention of the thermo-electrically heated base-plate of FIG. 1 for bonding the optically nonlinear crystal thereon

FIG. 7 schematically illustrates one arrangement in accordance with the present invention for bonding crystal 12 of FIG. 1 on a thermo-electrically heated base-plate 14A, depicted in cross-section. Base-plate 14A has three bonding mesas 30A, 30B, and 30C at corners of an imaginary triangle, similar to support points of a kinematic mount. Mesas 30A and 30B are preferably aligned on a line 32 parallel to the b-axis of crystal 12. The mesas are below the level of thermo-electrically (TEC) heated base-plate 14A and each thereof is surrounded by an annular channel 34 in the base plate. Bonding of the crystal to the base-plate if effected by an adhesive layer 36 on each of the mesas.

At least one of the three adhesive layers is of a soft, i.e., flexible, adhesive such as silicone. In a preferred arrangement the adhesive layer on mesa 36 is of a flexible adhesive and the adhesive layers on mesas 36A and 36B are of a hard (rigid) adhesive such as epoxy. In this arrangement, differential expansion in the base-plate plane perpendicular to the b-axis of the crystal will be accommodated which will avoid tilting of reflective coated face 18 of the crystal by forces other than thermal anisotropy of the crystal. Differential expansion in the b-axis direction will not be accommodated, however, differential CTE forces in this direction do not affect the tilting of face 18 of the crystal. Clearly, all of the adhesive layers can be flexible but this may not provide as positive a bond as the above-described arrangement including hard and soft adhesive layers.

An alternate method of mitigating differential CTE forces in bonding a crystal such as crystal 12 to a heated base plate is to arrange the crystal cut angles such the crystal has an effective CTE in the base-plate plane which matches the CTE of the base-plate material. The effective CTE in the base-plate plane $(CTE(\phi,\theta))$ can be defined by an equation:

$$CTE(\phi,\theta)=Cos^2(\phi)*Sin^2(\theta)*CTE_a+Sin^2(\phi)* Sin^2(\theta)*CTE_c+Cos^2(\theta)*CTE_b \qquad (2)$$

Where $CTE_a$, $CTE_b$, and $CTE_c$ are the CTEs in the a-, b-, and c-axes respectively.

Figure 8:
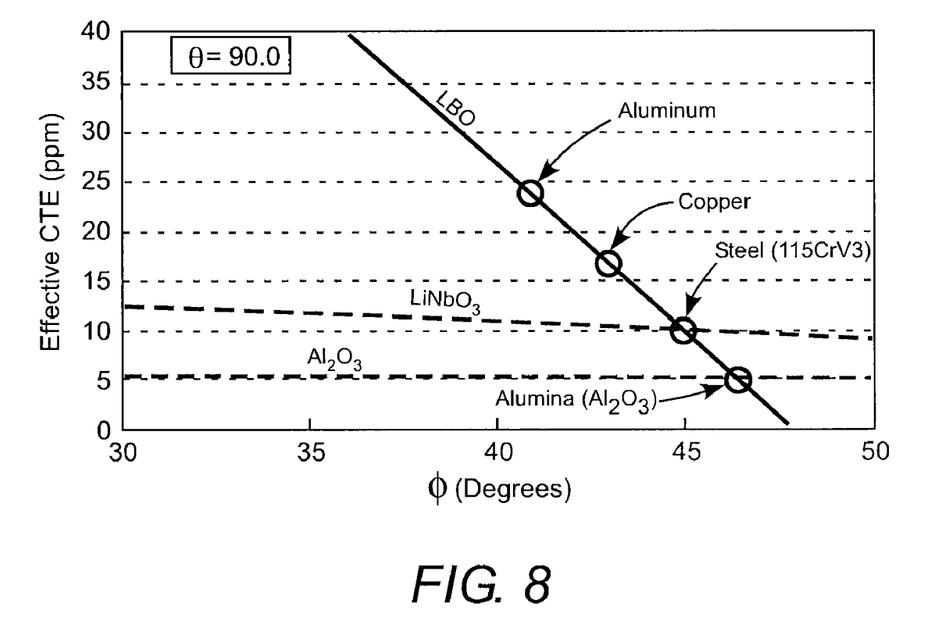
FIG. 8 is a graph schematically illustrating effective coefficient of thermal expansion (CTE) in the plane of the base-plate of FIG. 7 as a function of crystal-cut angle ϕ for various thermally anisotropic crystals.

FIG. 8 is a graph schematically illustrating the effective CTE in the plane of the base-plate as a function of crystal-cut angle $\phi$ for LBO, $LiNbO_3$, and $Al2O_3$, cut with $\theta=90°$. It can be seen that LBO, having a relatively very high degree of thermal anisotropy can be cut to match the CTE of aluminum, copper, steel (here a chromium vanadium steel 115CrV3) and polycrystalline alumina. It can be seen also (with additional reference to FIG. 3) that these matches all occur at values of $\phi$ between about 40° and 47°, where the thermal coefficient of deformation is at or near a maximum.

Figure 7A:
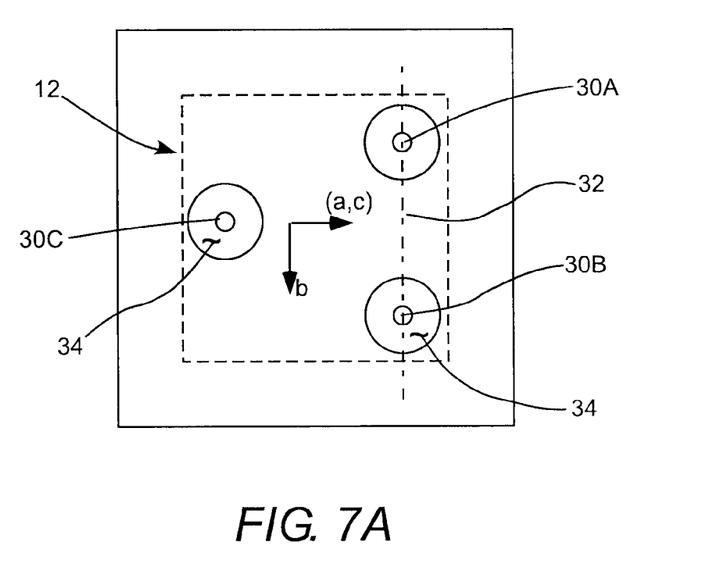

It should be noted here, that these CTE matches are in a direction parallel to the a-c plane of the crystals concerned, i.e., normal to face 18 in an undistorted crystal 12, and that CTE in the b-axis direction is not matched. As noted above, however, with reference to the arrangement of FIGS. 7 and 7A that a CTE mismatch in the C-axis direction has no effect on the alignment of reflective coated face 18 of crystal 12. It would of course be possible, to obtain a CTE match in both the a-b plane and the C-axis direction by selecting a non-orthogonal angle for $\theta$. This, however, would cause a compound tilting of reflective coated face 18, which may not be desirable.

Figure 9:
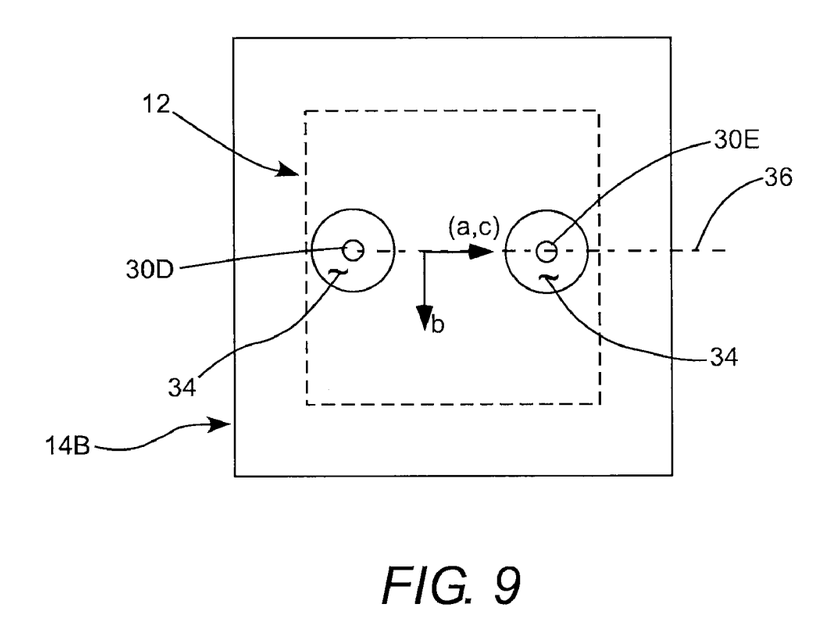
FIG. 9 schematically illustrates an arrangement in accordance with the present invention of the thermo-electrically heated base-plate of FIG. 1 for bonding the thermally anisotropic crystal thereon cut such that the crystal has an effective CTE in the base-plate plane that matches the CTE of the base-plate material.

FIG. 9 schematically illustrates an arrangement for mounting a CTE matched crystal 12 of a TEC heated base-plate. Here a base-plate 14B is configured with bonding mesas surrounded by annular channels as in base-plate 14A of FIGS. 7 and 7A. In base-plate 14B, however, there are only two mesas (mesas 30D and 30E) and these are aligned of a line 36 parallel to the a-c plane of crystal 12. As the crystal and base-plate CTEs are matched in this direction, crystal 12 can be bonded to mesas 30D and 30E with a hard adhesive. Because of the relatively small area of the mesas the crystal is essentially unconstrained in the b-axis direction where the CTEs are not matched.

Figure 10:
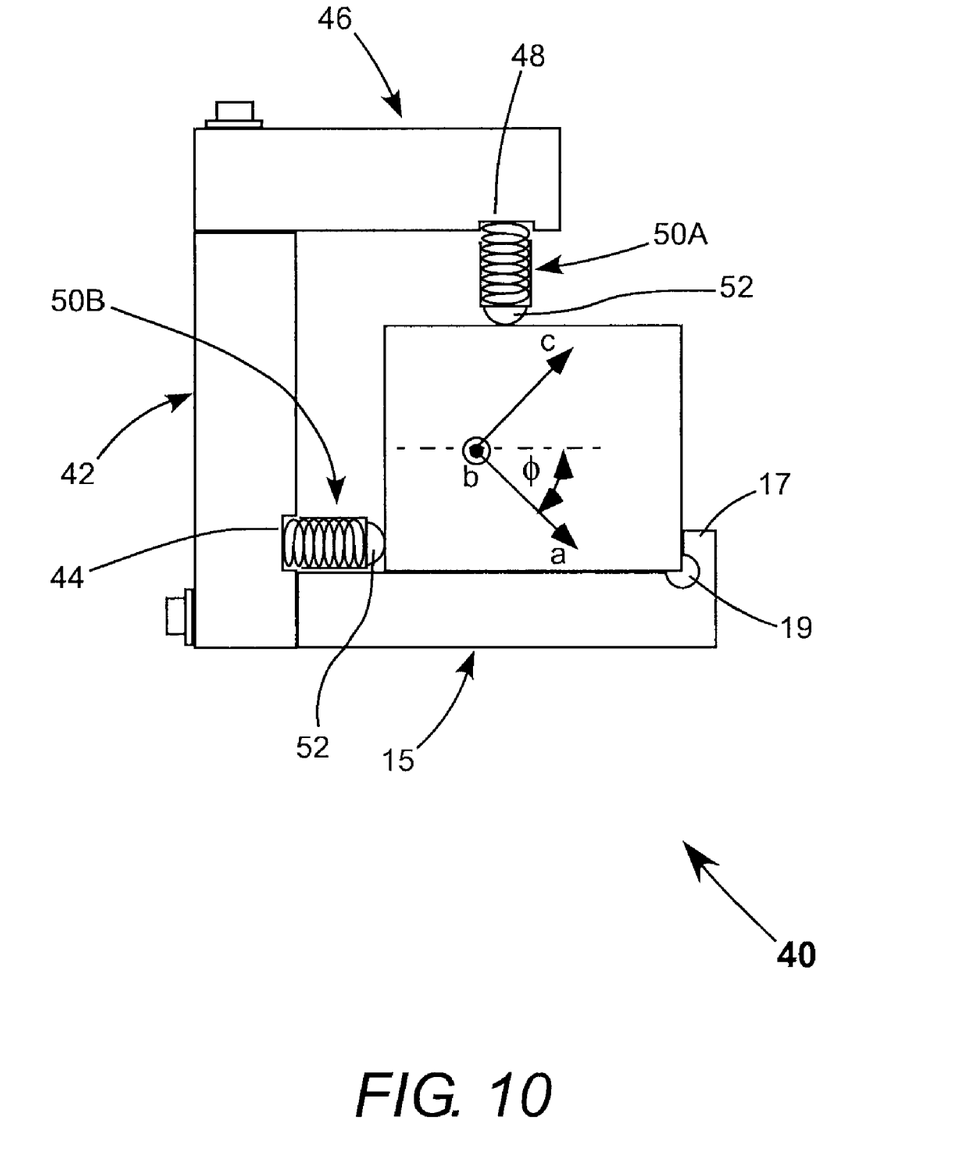
FIG. 10 schematically illustrates an arrangement for clamping a thermally anisotropic crystal on a thermo-electrically heated base-plate in a manner such that differential thermal expansion of the crystal and the base-plate can be accommodated.

FIG. 10 schematically illustrates an arrangement 40 for clamping a thermally anisotropic crystal on thermo-electrically heated base-plate in a manner such that differential thermal expansion of the crystal and the base-plate can be accommodated.

Here, a heated base-plate 15 has a vertical clamp support bracket 42 attached thereto. A horizontal clamp support bracket 46 is attached to the vertical support bracket. A spring-loaded, ball-tipped piston 50A has one end thereof is located in a recess 48 in bracket 46. The spring compression of piston 50A urges crystal 12 into contact with base-plate 15. A similar piston 50B has one end thereof is located in a recess 44 in bracket 42. The spring compression of piston 50B urges crystal 12 into contact with an upwardly extending lip portion 17 of the base-plate. A relief channel 19 at base of lip portion 17 provides for positive engagement or the crystal with the lip portion of the base-plate. Expansion or contraction of the crystal in the a-axis or b-axis thereof is accommodated by the pistons 50A and 50B. Ball tips 52 of the pistons provide that expansion or contraction of the crystal in the b-axis thereof is essentially unconstrained. Regarding other possible bonding methods, hard bonding of crystal 12 to a flexure mount may be considered.

The bonding and clamping arrangements discussed above are merely exemplary and should not be considered as limiting. Those skilled in the mechanical engineering from the foregoing detailed description of the present invention may conceive of other bonding or clamping arrangements without departing from the spirit and scope of the present invention.

Further while the temperature of crystal in all of the above-described is varied by supporting the element on a heatable base-plate, this should also not be construed as limiting the invention. Those skilled in the art will recognize that the crystal could be heated by other means, for example, in an oven having an optical access (window or windows) for the beam to be steered without departing from the spirit and scope of the invention.

In summary, the present invention is described above with reference to a preferred and other embodiments. The invention is not limited, however, to the embodiments described and depicted herein. Rather the invention is limited only by the claims appended hereto.

What is claimed is:

1. Apparatus for steering a beam of radiation, comprising:
    a thermally anisotropic element configured such that the shape of the optical element can be varied by varying the temperature of the element;
    means for varying the temperature of the thermally anisotropic element; and
    wherein the beam is one of reflected from and transmitted through the element in a manner such that the direction of the beam on leaving the element can be varied by the change of shape resulting from the temperature variation.

2. The apparatus of claim 1, wherein the thermally anisotropic element has at least first and second different coefficients of thermal expansion in first and second directions at an angle to each other, the shape of element is varied on varying the temperature of the element by a difference in expansion in the two different directions.

3. The apparatus of claim 2, wherein the thermally anisotropic element has a surface thereof on which a reflective coating is deposited, and wherein the beam is reflected from the reflective-coated surface the optical element.

4. The apparatus of claim 3, wherein the reflective coated surface is a plane surface and the first and second directions lie in a plane perpendicular to the plane of the reflective coated surface such that the variation of the beam direction occurs only in a plane parallel to the plane in which the first and second directions lie.

5. The apparatus of claim 2, wherein the thermally anisotropic element has first and second plane faces, spaced apart and parallel to each other and wherein the beam is transmitted through the element, entering via the first surface and leaving by the second surface.

6. The apparatus of claim 5, wherein the reflective coated surface is a plane surface and the first and second directions lie in a plane perpendicular to the planes first and second surfaces, such that the variation of the beam direction occurs only in a plane parallel to the plane in which the first and second directions lie.

7. The apparatus of claim 2, wherein the thermally anisotropic element is a crystal and the first and second directions correspond to respectively an a-axis and a c-axis of the crystal, the a-axis and c-axis being perpendicular to each other and the crystal having a b-axis perpendicular to the a-axis and the b-axis.

8. The apparatus of claim 7, wherein the beam leaves the crystal via a plane face thereof, being either reflected from or transmitted through that face according to whether the beam is respectively reflected from or transmitted through the crystal, and wherein the b-axis is parallel to the plane of the face and the a-axis is at a non-orthogonal angle to the face.

9. The apparatus of claim 8, wherein the crystal is a crystal of an optically nonlinear material.

10. The apparatus of claim 9, wherein the optically nonlinear material is lithium borate (LBO).

11. The apparatus of claim 9, wherein the beam radiation has a fundamental frequency and is transmitted through the crystal, and wherein the crystal is configured such that at any contemplated beam-steering temperature of the crystal the radiation in the beam will not be converted to different frequency by the optical nonlinearity of the material.

12. The apparatus of claim 2, wherein the means for varying the temperature of the element includes a heatable plane base-plate on which the element is supported and to which the element is attached.

13. The apparatus of claim 12, wherein the first and second directions are at an angle to the plane of the base-plate and the angle is selected such that in at least one direction parallel to the plane of the base plate, the element has an effective coefficient of thermal expansion about matched to the coefficient of thermal expansion of the material of the base-plate.

14. The apparatus of claim 13, wherein the thermally anisotropic element is a crystal and the first and second directions correspond to respectively an a-axis and a b-axis of the crystal, the a-axis and b-axis being perpendicular to each other and the crystal having a c-axis perpendicular to the a-axis and the b-axis.

15. The apparatus of claim 14, wherein the beam leaves the crystal via a plane face thereof, being either reflected from or transmitted through that face according to whether the beam is respectively reflected from or transmitted through the crystal, and wherein the c-axis is parallel to the plane of the face, the a-axis is at a non-orthogonal angle to the face, and the direction of the coefficient of thermal expansion matching is perpendicular to the c-axis.

16. The apparatus of claim 15, wherein the crystal is a crystal of LBO and the effective coefficient of thermal expansion of the crystal is matched to the coefficient of thermal expansion of one of copper, aluminum, and steel.

17. An apparatus for steering a beam of radiation comprising:
    an optical crystal having a planar reflecting face, said crystal being formed from a material such that upon heating, the shape of the crystal will deform in a manner to cause the reflecting face to tilt; and
    a heating element coupled crystal for varying the temperature of the crystal to cause the reflecting face to tilt and thereby steer a beam of radiation that is directed to and reflects from the reflecting face.

18. An apparatus as recited in claim 17, wherein said crystal is thermally anisotropic.

19. An apparatus as recited in claim 17, wherein the crystal is formed from a nonlinear material.

20. A method of steering a beam of radiation comprising the steps of:
    directing the beam to a reflecting face of an optical crystal, said crystal being formed from a material such that upon heating, the shape of the crystal will deform in a manner to cause the reflecting face to tilt; and
    heating the crystal to cause the reflecting face to tilt thereby steering the beam of radiation.

* * * * *